(12) United States Patent
Elrod et al.

(10) Patent No.: US 8,258,844 B2
(45) Date of Patent: Sep. 4, 2012

(54) SYSTEM-WIDE RESET OF MULTIPLE ELECTRONIC DEVICES

(75) Inventors: Jay Rodger Elrod, Bloomington, MN (US); Charles William Thiesfeld, Lakeville, MN (US); Jon David Trantham, Chanhassen, MN (US)

(73) Assignee: Seagate Technology LLC, Cupertino, CA (US)

( * ) Notice: Subject to any disclaimer, the term of this patent is extended or adjusted under 35 U.S.C. 154(b) by 914 days.

(21) Appl. No.: 11/498,503

(22) Filed: Aug. 3, 2006

(65) Prior Publication Data

US 2008/0030245 A1    Feb. 7, 2008

(51) Int. Cl.
*H03K 3/02*    (2006.01)
(52) U.S. Cl. .................. 327/198; 327/142
(58) Field of Classification Search .......... 327/141–143, 327/198, 307–309
See application file for complete search history.

(56) References Cited

U.S. PATENT DOCUMENTS

| | | | |
|---|---|---|---|
| 5,801,561 A * | 9/1998 | Wong et al. | 327/143 |
| 5,825,708 A | 10/1998 | Bennett | |
| 5,894,240 A * | 4/1999 | Shieh et al. | 327/142 |
| 6,085,342 A * | 7/2000 | Marholev et al. | 714/724 |
| 6,118,314 A * | 9/2000 | Arnould et al. | 327/141 |
| 6,529,053 B2 * | 3/2003 | Jensen | 327/142 |
| 6,690,220 B2 * | 2/2004 | Kuboshima et al. | 327/198 |
| 6,950,255 B2 | 9/2005 | Imai | |
| 7,026,849 B2 * | 4/2006 | Ichikawa | 327/142 |
| 7,081,780 B2 * | 7/2006 | Briggs et al. | 327/143 |
| 2001/0017791 A1 * | 8/2001 | Funyu et al. | 365/189.07 |

* cited by examiner

*Primary Examiner* — Patrick O'Neill
(74) *Attorney, Agent, or Firm* — David K. Lucente

(57) ABSTRACT

In general, this disclosure describes techniques for implementing a system-wide reset of multiple devices. The techniques ensure that when any one of the devices of the system is reset, all the devices are reset. For example, a system includes a master reset device and a plurality of slave reset devices that are interconnected by a single reset line to provide improved robustness against electrostatic discharge (ESD) and electromagnetic pulse events. The master reset device detects a reset signal on the reset line and retransmits a true reset signal on the reset line in response to detecting the reset signal. Additionally, the master reset device may enter a blocking state after retransmitting the true reset signal to prevent detecting the reset signal that it transmitted on the reset line to avoid reset lockup.

27 Claims, 5 Drawing Sheets

SYSTEM-WIDE RESET OF MULTIPLE ELECTRONIC DEVICES

TECHNICAL FIELD

The invention relates to techniques for resetting multiple electronic devices.

BACKGROUND

Many systems include multiple devices or components that must be commonly reset at particular times. The devices or components may, for example, need to be reset at power-up, upon expiration of a watchdog timer, upon detection of a voltage below a threshold, and the like. The devices or components may be interconnected by one or more reset lines via which reset signals are sent among the devices. Each of the devices may include reset circuitry that resets the device to a reset state upon receiving a reset signal on the reset line.

SUMMARY

The reset line is especially susceptible to noise because of its nature and because it may be connected to several components. Noise can come from many sources, including electrostatic discharge and electromagnetic pulse events. Noise on the reset line may cause one or more of the devices or components to reset inadvertently, i.e., falsely reset. To reduce the probability of noise invoking a false reset, each of the devices or components may include a filter that filters out signals on the reset line that are not of sufficient amplitude, duration or the like. Thus, the filters reduce the likelihood of detecting false resets. The filters, however, do not guarantee that inadvertent resets will not occur. As such, signals on the reset line caused by noise or other means may inadvertently reset a portion of the devices or components, such as devices whose filters are more sensitive to noise, while not resetting others.

In general, this disclosure describes techniques for implementing a system-wide reset of multiple devices. The techniques ensure that when any one of the devices of the system is reset, all the devices are reset. For example, a system includes a master reset device and a plurality of slave reset devices that are interconnected by a single reset line to provide improved robustness against electrostatic discharge (ESD) and electromagnetic pulse events. The master reset device ensures that all the devices of the system are reset when any one of the devices is reset.

The master reset device detects reset signals on the reset line. In response to detecting the reset signal on the reset line, the master reset device retransmits a true reset signal onto the reset line. The true reset signal retransmitted on the reset line is of sufficient amplitude and duration to activate the reset circuitry of all the slave reset devices. The master reset device retransmits the reset signal to the slave reset devices regardless of whether the detected reset signal was a false reset signal or a true reset signal. In this manner, the master reset device ensures that all the devices of system are reset.

Additionally, the master reset device may enter a blocking state after retransmitting the reset signal. During the blocking state, the master reset device blocks itself from detecting the reset signal that it transmitted on the reset line, thus preventing the perpetual retransmission of reset signals on the reset line.

In one embodiment, a system includes a master reset device and a plurality of slave reset devices. The slave reset devices and the master reset device are interconnected by a reset line. The master reset device detects a first reset signal on the reset line and retransmits a second reset signal on the reset line in response to detecting the first reset signal. The slave reset devices reset in response to the second reset signal.

In another embodiment, a method includes detecting a first reset signal and transmitting a second reset signal on a reset line in response to detecting the first reset signal.

In a further embodiment, a device includes a reset signal generator that generates and transmits a reset signal on a reset line in response to detecting an externally generated reset signal on the reset line.

In yet another embodiment, this disclosure is directed to a plurality of interconnected reset devices each having a reset signal sensitivity, wherein at least one of the plurality of reset devices has a highest reset signal sensitivity to a first reset signal and is adapted to send a second reset signal to at least another of the plurality of reset devices in response to detecting the first reset signal.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
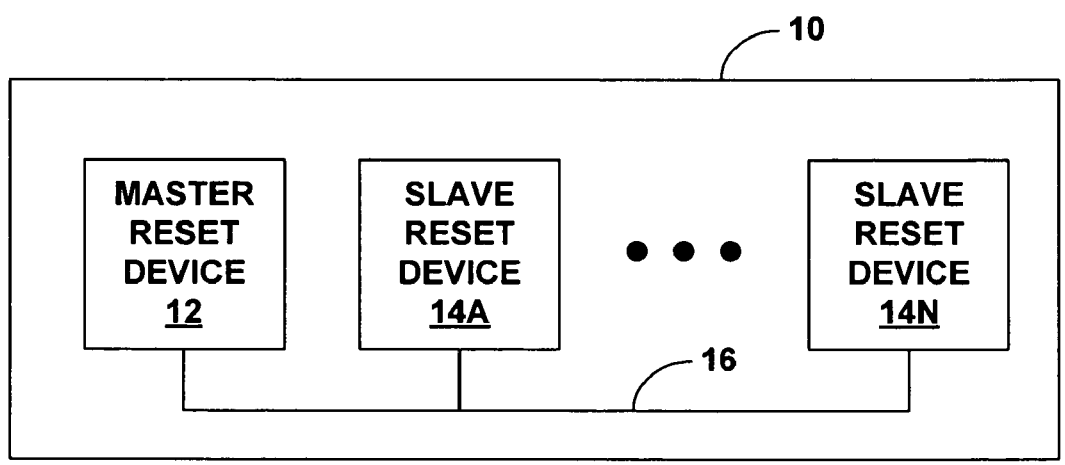
FIG. 1 is a block diagram illustrating a system for implementing a system-wide reset of multiple devices.

FIG. 1 is a block diagram illustrating a system 10 for implementing a system-wide reset of multiple devices. System 10 includes a plurality of devices that each contains reset circuitry or is capable of sending a reset signal to another device with reset circuitry. Specifically, system 10 includes a master reset device 12 and slave reset devices 14A-N ("slave reset devices 14"). Master reset device 12 and slave reset devices 14 interact to ensure that all the devices reset when any one of the devices reset. Master reset device 12 and slave reset devices 14 may be any device or component of a device that utilizes reset functionality. In one embodiment, for example, system 10 may be a printed circuit board with multiple integrated circuits (ICs). In this case, one the ICs would be designated as a master and the other ICs as slaves. As another example, master reset device 12 and slave reset devices 14 may be logic blocks integrated into a single IC.

Master reset device 12 and slave reset devices 14 are interconnected via a reset line 16. In exemplary embodiment of FIG. 1, reset line 16 comprises a bi-directional reset line that allows master reset device 12 and slave reset devices 14 to send and receive reset signals on a single reset line. Utilizing a single bidirectional reset line potentially reduces the pin count, signal count, physical space requirements and complexity of system 10. In the case in which master reset device 12 and slave reset devices 14 are ICs, for example, each of the reset devices only requires a single reset pin, thus reducing the amount of space required for mounting the ICs. Alternatively, however, master reset device 12 and slave reset devices 14 may be interconnected via more than one reset line.

Master reset device 12 monitors reset line 16 for reset signals. Master reset device 12 detects both "true" reset signals and "false" reset signals. As used herein, the term "true" reset signal refers to a reset signal that was intentionally sent from one of the reset devices, which is of sufficient amplitude and duration to activate the reset circuitry of all the slave reset devices 14. The term "false" reset signal, as used herein, refers to any reset signal that is not a true reset signal, e.g., a reset signal generated by noise or other means. A false reset signal is often of insufficient amplitude to activate the reset circuitry of all slave reset devices 14. As described above, however, the false reset signal may activate the reset circuitry of a portion of slave reset devices 14. Master reset device 12 has a high sensitivity for detecting false resets. Particularly, master reset device 12 preferably has a higher sensitivity for detecting false resets than any of slave reset devices 14. The high sensitivity to false resets increases the likelihood that should one or more of slave reset devices 14 detect a false reset, master reset device 12 also detects the false reset.

Master reset device 12 generates and transmits a reset signal (e.g., pulse) onto the reset line upon detecting a reset signal. The reset signal generated and transmitted by master reset device 12 is of sufficient amplitude and duration to activate the reset circuitry of slave reset devices 14. Master reset device 12 generates and transmits a reset signal to slave devices 14 regardless of whether the detected reset signal was a false reset signal or a true reset signal. Moreover, master reset device 12 generates and transmits the reset signal to slave reset devices 14 regardless of whether the detected reset signal was internally generated by master reset device 12 or externally generated. In this manner, master reset device 12 ensures that all the devices of system 10 are reset.

Master reset device 12 blocks the reset signal that it transmitted on reset line 16 in order to prevent reset lockup, i.e., perpetual retransmission of reset signals on reset line 16. In other words, master reset device 12 does not detect the reset signal that it transmitted on reset line 16.

Slave reset devices 14 also respond to the transmitted reset signal transmitted by master reset device 12 by activating their respective reset circuitries. Thus, slave reset devices 14 detect reset signals on reset line 16 and reset their respective circuitries to a reset state. Slave reset devices 14 may detect both true reset signals and false reset signals. As described above, however, slave reset devices 14 are designed to be less sensitive to false reset signals than master reset device 14. Thus, if any of slave reset devices 14 detect a false reset signal on reset line 16, master reset device 12 will also detect the false reset signal and in turn transmit a true reset signal to ensure that all slave reset devices 14 are reset.

Moreover, one or more of slave reset devices 14 may be capable of transmitting reset signals on reset line 16 in addition to detecting reset signals. Thus, slave reset devices 14 may be both reset invokers and reset receivers. Slave reset devices 14 may, for example, transmit reset signals on reset line 16 upon detecting internally generated resets. Master reset device 12 receives reset signals from slave reset devices 14 and retransmits another reset signal on reset line 16. In this manner, master reset device 12 ensures that all slave reset devices 14 are reset whenever master reset device 12 is reset, thus providing improved robustness against electrostatic discharge (ESD) and electromagnetic pulse events.

Although slave reset devices 14 are described in FIG. 1 as being capable of both receiving and invoking reset signals, slave reset devices 14 need not be capable of both receiving and invoking reset signals. For example, a portion of slave reset devices 14 may only be capable of detecting reset signals or only be capable of invoking/transmitting reset signals.

Figure 2:
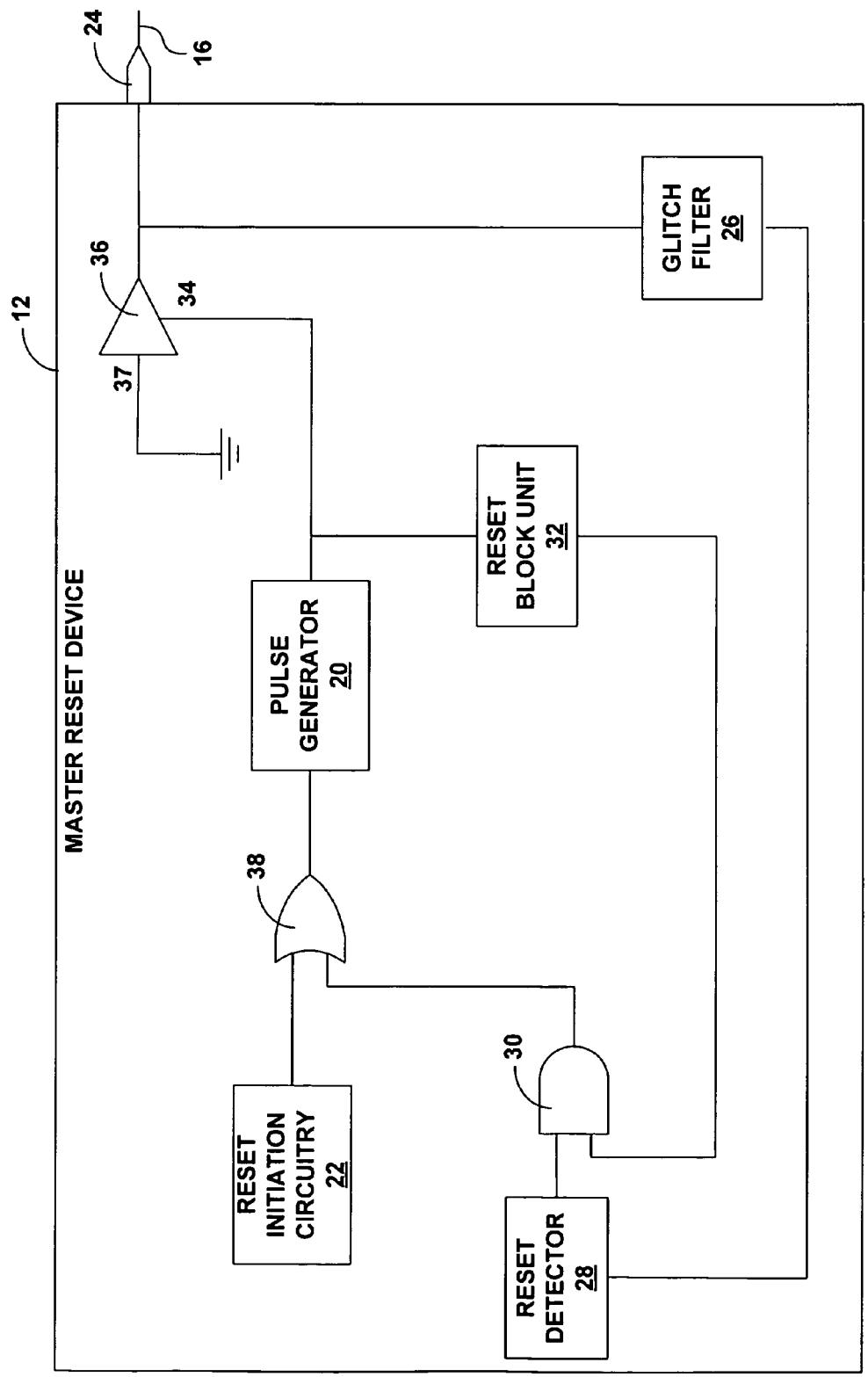
FIG. 2 is a block diagram illustrating an exemplary master reset device in further detail.

FIG. 2 is a block diagram illustrating an exemplary master reset device 12 in further detail. As described above, master reset device 12 detects reset signals on reset line 16 and retransmits a new reset signal in response to detecting the reset signal on reset line 16.

Master reset device 12 includes a reset signal generator, such as pulse generator 20, that generates a reset signal (i.e., reset pulse) for transmission on reset line 16. The reset signal generated by pulse generator 20 is of a sufficient amplitude and duration to reset all of slave reset devices 14 (FIG. 1). For example, pulse generator 20 may generate a pulse of approximately 800 nanoseconds. Pulse generator 20 may generate the reset signal upon detecting a reset signal on reset line 16, i.e., an externally generated reset signal. As described above, the reset signal detected on reset line 16 may be either a true reset signal transmitted by one of slave reset devices 14 or a false reset signal generated by noise or some other means. Alternatively, pulse generator 20 may generate a reset signal upon detecting an internally generated reset from internal reset initiation circuitry 22. Reset initiation circuitry 22 may, for example, comprise circuitry that generates an internal reset signal after expiration of a watchdog timer, upon detecting a voltage below a reset threshold voltage or the like.

Master reset device 12 includes a reset pin 24 that electrically couples to reset line 16. In the embodiment illustrated in FIG. 2, master reset device 12 includes only a single reset pin, thus reducing the amount of circuit board space required to mount master reset device 12. Master reset device 12 transmits the reset signal onto reset line 16 via reset pin 24. The output of pulse generator 20 acts as an enable signal 34 for the output driver 36. In other words, output driver 36 is not activated unless pulse generator 20 provides an enable signal.

In the embodiment illustrated in FIG. 2, input 37 of output driver 36 is tied low such that the reset signal on reset line 16 is active-low. This active-low configuration is commonly referred to as an "open collector" or "open drain" configuration. In some embodiments, master reset device 12 may tie input 37 of output driver 36 high rather than low if the devices of system 10 are designed to be activated by an active-high reset signal. This active-high configuration is commonly referred to as an "open source" configuration. In either configuration, a high impedance resistor (not shown in FIG. 2) is used on reset line 16 to pull the line to its respective inactive state when the line is not being actively driven by one of the devices of system 10. This high impedance resistor may be internal to one of the devices of system 10. Slave devices 14 of system 10 that are designed to drive a reset onto reset line 16 have output logic that functions in the same way as output driver 36. In other words, the devices contain logic to actively drive the reset line 16 to the active state, and to otherwise release reset line 16 such that the high impedance resistor will pull the line to the inactive state.

Master reset device 12 also includes a glitch filter 26 that filters signals received on reset line 16. Particularly, glitch filter 26 filters out false reset signals that are smaller than the filter parameters. The parameters of glitch filter 26 are set such that glitch filter 26 has a higher sensitivity to false resets than glitch filters of any of slave reset devices 14 (FIG. 1). The high sensitivity to false reset signals ensures that should one or more of slave reset devices 14 detect a false reset signal, master reset device 12 also detects the false reset signal and initiates a reset of all the devices of system 10. As an example, glitch filter 26 may be configured to filter out any signal on reset line 16 that has a duration of less than four nanoseconds, but to respond to any signal with a duration of greater than four nanoseconds. The glitch filters of the slave devices 14 may be set to filter out any signal on reset line 16 with a duration of less than ten nanoseconds. Thus, if a noise signal with a duration of 7 nanoseconds is generated on reset line 16 master reset device would identify it as a reset signal and initiate a system-wide reset. Glitch filter 26 may be configured to filter based on signal parameters other than duration. For example, glitch filter 26 may filter signals on reset line 16 based on signal amplitude or a combination of duration and pulse amplitude.

The output of glitch filter 26 is input by a reset line signal detector 28 (labeled "RESET DETECTOR 28" in FIG. 2). Reset line signal detector 28 generates a high pulse (e.g., 1) when a reset signal is detected on reset line 16 and not filtered out by glitch filter 26. As in the case where glitch filter 26 filters out reset signals that are less than four nanoseconds in duration, reset line signal detector 28 would only generate a high pulse when reset signals with durations longer than four nanoseconds are on reset line 16. In one embodiment, reset line signal detector 28 may comprise a trailing edge pulse generator that generates a high pulse at the trailing edge of the reset signal detected on reset line 16.

Master reset device 12 also includes a reset block unit 32. Reset block unit 32 outputs a high pulse (e.g., 1) at all times except when master reset device 12 is in a blocking state. Reset block unit 32 generates a low pulse (e.g., 0) for a sufficient period of time to block detection of the reset signal transmitted by master reset device 12. In one embodiment, reset block unit 32 comprises a trailing edge pulse generator that generates a low pulse upon detecting the trailing edge of a reset pulse generated by pulse generator 20. Reset block unit 32 may, for example, generate the low pulse for 250 nanoseconds after detecting the trailing edge of the reset signal generated by pulse generator 20. The low pulse generated by reset block unit 32 acts as a blocking mechanism to ensure that master reset device 12 does not enter reset lockup.

The outputs of reset block unit 32 and reset line signal detector 28 are inputs of an AND gate 30. The output of AND gate 30 will be high whenever a reset signal not sent by master reset device 12 is detected on reset line 16. The output of AND gate 30 will be low whenever there is no reset signal detected on reset line 16 or when master reset device is in the blocking state. In this manner, AND gate 30 allows reset block unit 32 to block the reset signal transmitted by master reset device 12 on reset line 16.

The output of AND gate 30 is input into an OR gate 38. OR gate 38 also inputs the output of reset initiation circuitry 22. Thus, OR gate 38 outputs a high signal when either the output of reset initiation circuitry 22 is high, i.e., when an internal reset is necessary, or when there is a reset signal on reset line 16 and master reset device 12 is not in the blocking state. The output of OR gate 38 is input to pulse generator 20. As described above, pulse generator 20 generates a reset signal when the output of OR gate 38 is high. In this manner, master reset device 12 ensures that all slave reset devices 14 are reset whenever master reset device 12 detects a reset signal on reset line 16 or when an internally generated reset occurs.

Figure 3:
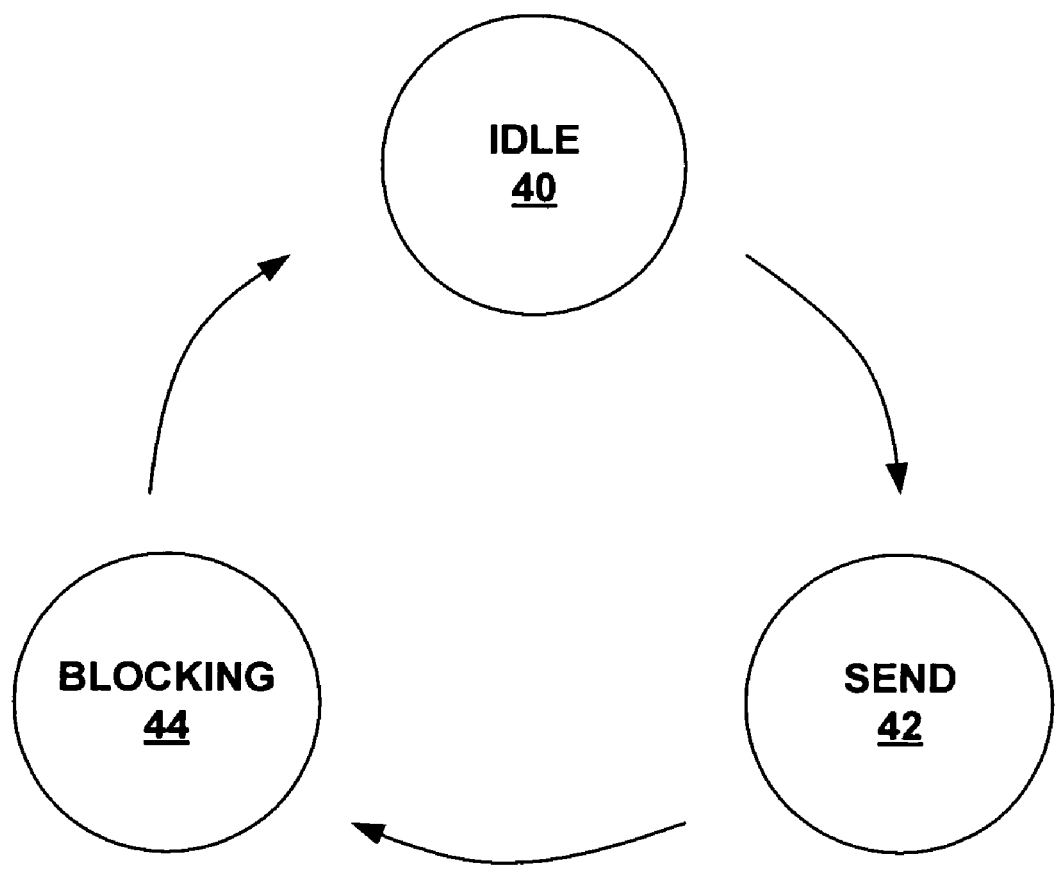
FIG. 3 is a state diagram illustrating the various states of a master reset device.

FIG. 3 is a state diagram illustrating the various states of master reset device 12. Initially, master reset device 12 is in idle state 40. While in idle state 40, master reset device 12 monitors for a reset signal. Master reset device 12 monitors reset line 16 and the output of reset initiation circuitry 22 for the reset signal. As described above, master reset device 12 monitors for both true reset signals and false reset signals. A portion of the false reset signals on reset line 16 may be filtered out by glitch filter 26 (FIG. 2). Particularly, glitch filter 26 filters out false reset signals of insufficient duration, amplitude or combination thereof. Moreover, the parameters of glitch filter 26 are set to make glitch filter 26 more sensitive to false resets than slave devices 14.

Upon detecting a reset signal from either reset initiation circuitry 22 or on reset line 16, master reset device 12 transitions from idle state 40 to send state 42. During send state 42, master reset device 12 generates a reset pulse and transmits the reset pulse on reset line 16 via reset pin 24. The reset pulse generated and sent by master reset device 12 is of a sufficient amplitude and duration to ensure that each of slave reset devices 14 resets.

Upon transmitting the generated reset signal, master reset device 12 transitions to a blocking state 44. Master reset device 12 may, for example, transition to blocking state 44 upon detecting a trailing edge of the reset signal generated by pulse generator 20. During blocking state 44 master reset device 12 prevents detection of the reset signal which it sent via reset line 16. In this manner, blocking state 44 prevents master reset device 12 from perpetually resetting system 10.

Master reset device 12 may transition from blocking state 44 to idle state 40 after a particular period of time. For example, master reset device 12 may transition from blocking state 44 to idle state 40 after 250 nanoseconds. Once in the idle state 40 again, master reset device 12 monitors for another reset signal.

Figure 4:
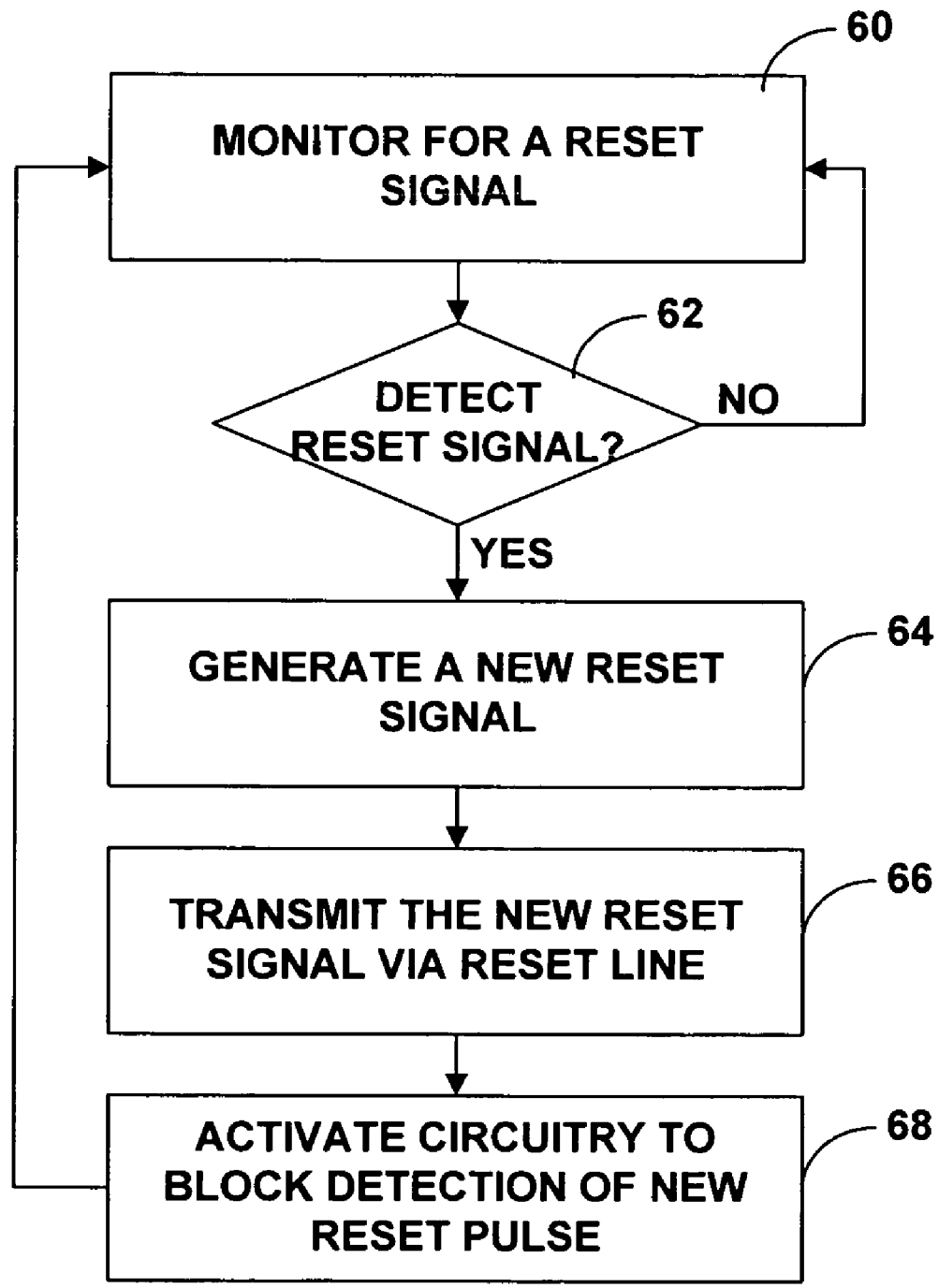
FIG. 4 is a flow diagram illustrating exemplary operation of a master reset device.

FIG. 4 is a flow diagram illustrating exemplary operation of master reset device 12. Master reset device 12 monitors for a reset signal (60). Master reset device 12 monitors reset line 16 as well as internal reset initiation circuitry 22. As described above, master reset device 12 has a higher sensitivity to false reset signals than any of slave reset devices 14, thus ensuring that if any of slave reset devices 14 detect a false reset signal, master reset device 12 also detects the false reset signal.

In response to detecting a reset signal (62), master reset device 12 generates a new reset signal (64). The new reset signal generated by master reset device 12 is of sufficient amplitude and duration to activate the reset circuitry of all slave devices 14. Master reset device 12 generates a new reset signal regardless of whether the detected reset was a false reset signal or a true reset signal.

Master reset device 12 transmits the new reset signal on reset line 16 (66). The transmitted reset signal is detected by slave devices 14, which transition to a reset state upon detecting the reset signal. Additionally, master reset device 12 activates circuitry to block detection of the transmitted reset signal (68). Blocking master reset device 12 from detecting the transmitted reset signal prevents reset lockup. In this manner, master reset device 12 implements a system-wide reset upon detecting a reset signal on reset line 16.

Figure 5:
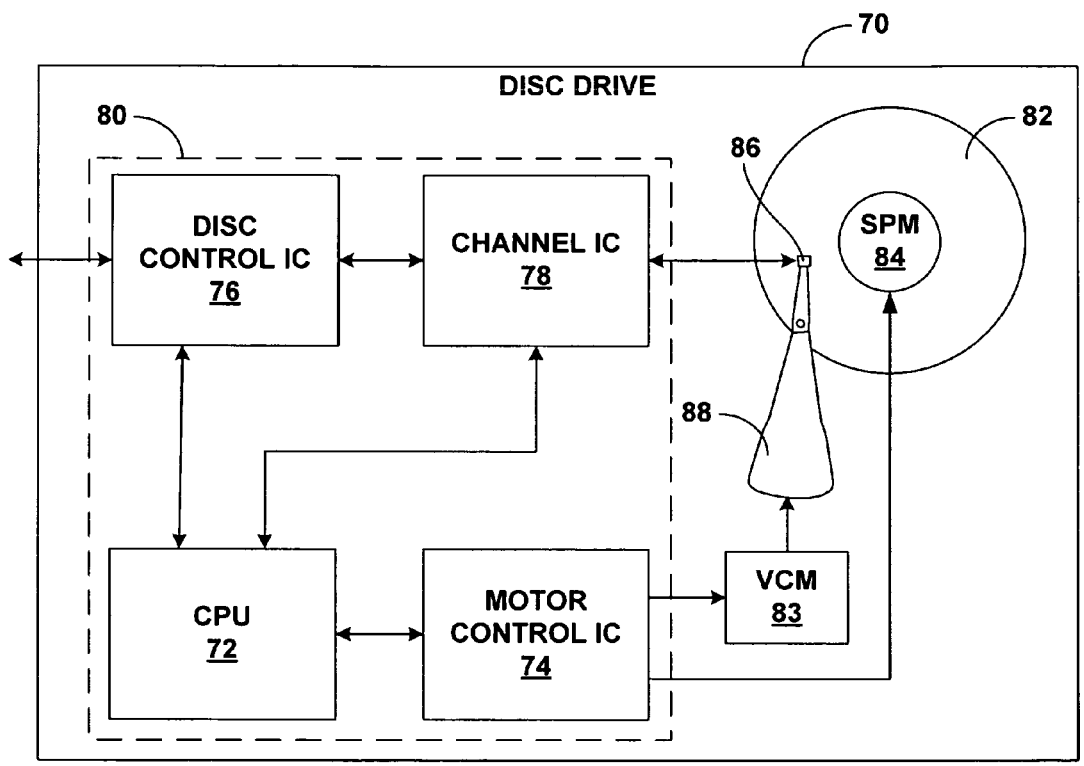
FIG. 5 is a schematic diagram illustrating an exemplary disc drive that utilizes the system-wide reset techniques.

FIG. 5 is a schematic diagram illustrating an exemplary disc drive 70 that utilizes the reset techniques described herein. Disc drive 70 includes a CPU 72, a motor control IC 74, a disc control IC 76 and a channel IC 78 mounted on a printed circuit board assembly 80. As will be described in detail, CPU 72, motor control IC 74, disc control IC 76 and channel IC 78 may each be considered a device as described in system 10 of FIG. 1.

Disc drive 70 also includes a magnetic disc medium 82, a voice coil motor (VCM) 83, a spindle motor (SPM) 84, a magnetic head 86 and an actuator 88. Magnetic disc medium 82 is mounted on SPM 84. SPM 84 rotates magnetic disc medium 82 at a high speed for reading and writing data onto magnetic disc medium 82.

Magnetic head 86 performs the read and write operations on magnetic disc medium 82. Magnetic head 86 may include a read head for performing read operations and a write head for performing write operations. Magnetic head 86 is mounted on actuator 88. VCM 83 controls the radial movement of acutator 88 across magnetic disc medium 82 to place magnetic head 86 at a target track on disc medium 82.

CPU 72 controls the operation of disc drive 70 using the various ICs. CPU 72 may control disc drive 70 in accordance with a control program stored in a memory (not shown) of disc drive 70. CPU 72 controls VCM 83 and SPM 84 via motor control IC 74. CPU 72 may, for example, calculate one or more control variables for determining driving currents of VCM 83 and SPM 84, and send the control variables to motor control IC 74. In this manner, CPU 72 controls the speed of rotation of disc medium 82 and positioning of magnetic head 86 via motor control IC 74.

Motor control IC 74 controls operation of VCM 83 and SPM 84 in accordance with the control variables received from CPU 72. Particularly, motor control IC 71 controls the driving current of VCM 83 and SPM 84. For example, motor control IC 71 may include a VCM driver and an SPM driver (not shown) that provide driving current to VCM 83 and SPM 84, respectively. In this manner, motor control IC 74 controls SPM 84 to spin magnetic disc medium 82 and VCM 83 to move actuator 88 to place magnetic head 86 at a target track for a read or write operation.

CPU 72 also controls the read/write functionality of disc drive 70 using disc control IC 76 and channel IC 78. CPU 72 may control, for example, the sequencing of the read and write operations requested by a host computing device. Disc control IC 76 controls interactions between disc drive 70 and the host computing device. Disc control IC 76 receives commands, such as read and write commands, from the host and controls data transfer between the host and disc drive 70. In this manner, disc control IC 76 functions as an interface between disc drive 70 and the host.

Channel IC 78 executes various signal processing functions, including analog to digital conversion, digital to analog conversion, encoding, decoding and the like. Channel IC 78 may include a read channel and a write channel (not shown). The read channel receives data read by magnetic head 86, converts the data from analog to digital and decodes the data. Channel IC 78 may forward the decoded data on to disc control IC 76 for transmission to the requesting host computing device. The write channel encodes data for writing onto magnetic disc medium 82, converts the data from digital to analog form and supplies the output to magnetic head 86 for writing onto magnetic disc medium 82.

As described above, disc drive 70 utilizes the reset techniques described herein. CPU 72, motor control IC 74, disc control IC 76 and channel IC 78 are mounted on printed circuit board assembly 80, and may be interconnected via a reset line, such as reset line 16 of FIG. 1. CPU 72 may function as a master reset device, while motor control IC 74, disc control IC 76 and channel IC 78 function as slave reset devices. Thus, CPU 72 detects a first reset signal the reset line and retransmits a second reset signal in response to detecting the first reset signal on the reset line. In this manner, CPU 72 ensures that all the various ICs are reset in the event that any of the ICs (including CPU 72) are reset.

FIG. 5 is described in the context of a plurality of ICs (the CPU being a complex IC) mounted on a printed circuit board for exemplary purposes. Alternatively, disc drive may comprise a plurality of ASICs or a combination of ASICs and ICs. Moreover, the functionality of the various ICs may be implemented as logic blocks, such as FPGAs, integrated into a single IC, where one of the logic blocks functions as the master reset device.

Various embodiments of the invention have been described. These and other embodiments are within the scope of the following claims.

The invention claimed is:

1. A system comprising:
   a master reset device; and
   a plurality of slave reset devices, the slave reset devices and the master reset device being interconnected by a reset line, wherein the master reset device detects a false reset signal on the reset line and retransmits a true reset signal on the reset line in response to detecting the false reset signal, wherein the false reset signal is insufficient to activate reset circuitry of each of the plurality of slave reset devices.

2. The system of claim 1, wherein the master reset device further comprises blocking circuitry that prevents the master reset device from detecting the true reset signal retransmitted by the master reset device on the reset line.

3. The system of claim 1, wherein the master reset device and the plurality of slave reset devices each comprise a glitch filter, further wherein the glitch filter of the master reset device is more sensitive to detecting false reset signals than the glitch filters of the plurality of slave reset devices.

4. The system of claim 1, wherein the master reset device detects an internally generated reset signal, generates a second true reset signal in response to detecting the internally generated reset signal, and transmits the second true reset signal on the reset line.

5. The system of claim 1, wherein the master reset device comprises a pulse generator to generate the true reset signal.

6. The system of claim 1, wherein the master reset device detects a first true reset signal from one of the plurality of slave reset devices on the reset line and retransmits a second true reset signal on the reset line in response to detecting the first true reset signal.

7. The system of claim 1, wherein the slave reset devices and the master reset device are interconnected by a single, bi-directional reset line.

8. The system of claim 1, wherein the system comprises a disc drive.

9. The system of claim 8, wherein the master reset device of the disc drive comprises a central processing unit (CPU) that controls operation of the disc drive, and further wherein the plurality of slave reset devices comprise a disc control integrated circuit (IC), a channel IC, and a motor control IC.

10. The system of claim 1, wherein the master reset device generates the true reset signal in response to an electrostatic discharge (ESD) event.

11. A method comprising:
    detecting a false reset signal, wherein the false reset signal is insufficient to activate reset circuitry of each of a plurality of slave reset devices;
    transmitting a true reset signal on a reset line in response to detecting the false reset signal.

12. The method of claim 11, further comprising blocking detection of the true reset signal retransmitted on the reset line.

13. The method of claim 11, further comprising filtering signals on the reset line using a glitch filter, wherein the glitch filter is more sensitive to detecting false reset signals than glitch filters of other reset devices interconnected via the reset line.

14. The method of claim 11, further comprising generating the true reset signal.

15. The method of claim 11, further comprising:
    detecting a first true reset signal sent by another reset device on the reset line; and
    retransmitting a second true reset signal on the rest line in response to detecting the first reset signal.

16. The method of claim 11, further comprising:
detecting an internally generated reset signal;
generating a second true reset signal in response to detecting the internally generated reset signal; and
transmitting the second true reset signal on the reset line.

17. The method of claim 11, wherein detecting the false reset signal on the reset line comprises detecting the false reset signal on a bi-directional reset line.

18. The method of claim 11, further comprising transmitting the true reset signal in response to an electrostatic discharge (ESD) event.

19. A device comprising a reset signal generator that generates and transmits a true reset signal on a reset line in response to detecting a false reset signal on the reset line, wherein the true reset signal is of sufficient strength to activate reset circuitry of each of a plurality of slave devices and the false reset signal is of insufficient strength to active the reset circuitry of each of the plurality of slave devices.

20. The device of claim 19, wherein the reset signal generator generates and transmits a second true reset signal on the reset line in response to detecting an internally generated reset signal.

21. The device of claim 19, further comprising a reset blocking unit that prevents the device from detecting the true reset signal transmitted by the device on the reset line.

22. The device of claim 19, further comprising a filter that filters signals on the reset line, wherein the filter is more sensitive to detecting false reset signals than filters of other reset devices interconnected via the reset line.

23. The device of claim 19, wherein the reset signal generator detects a first true reset signal from one of the plurality of other devices on the reset line and retransmits a second true reset signal on the reset line in response to detecting the first true reset signal.

24. The device of claim 19, wherein the device comprises an integrated circuit (IC).

25. The device of claim 19, wherein the device comprises a logic block of an integrated circuit (IC).

26. The device of claim 19, wherein the reset signal generator generates the true reset signal in response to an electrostatic discharge (ESD) event.

27. A plurality of interconnected reset devices each having a reset signal sensitivity, wherein at least one of the plurality of reset devices has a highest reset signal sensitivity to a false reset signal and is adapted to send a true reset signal to at least another of the plurality of reset devices in response to detecting the false reset signal, wherein the false reset signal is insufficient to activate reset circuitry of the another of the plurality of reset devices.

* * * * *